United States Patent [19]

Hanley

[11] Patent Number: 4,851,691
[45] Date of Patent: Jul. 25, 1989

[54] METHOD FOR PHOTORESIST PRETREATMENT PRIOR TO CHARGED PARTICLE BEAM PROCESSING

[75] Inventor: Peter R. Hanley, Gloucester, Mass.

[73] Assignee: Varian Associates, Inc., Palo Alto, Calif.

[21] Appl. No.: 443,080

[22] Filed: Nov. 19, 1982

[51] Int. Cl.⁴ ............................................ H01J 37/317
[52] U.S. Cl. .................................. 250/492.2; 437/20;
    437/928; 437/931
[58] Field of Search ............. 250/492.2, 492.3, 492.21;
    29/576 B; 148/1.5, 187; 437/20, 928, 931

[56] References Cited

U.S. PATENT DOCUMENTS

| | | | |
|---|---|---|---|
| 3,615,875 | 10/1971 | Morita et al. | 148/1.5 |
| 4,011,449 | 3/1977 | Ko et al. | 250/492.21 |
| 4,253,888 | 3/1981 | Kikuchi | 148/187 |

OTHER PUBLICATIONS

T. C. Smith, "Wafer Cooling and Photoresist Masking Problems in Ion Implantation," Fourth Int. Conf., Ion Implantation: Equipment and Techniques, Berchtesgaden, West Germany, Sep. 13–17, 1982.

Wilson and Brewer, "Ion Beams with Applications to Ion Implantation," R. Krieger Publishing Co., Huntington, New York, 1979, Reprint of J. Wiley, New York, 1973, pp. 276–278.

Primary Examiner—Alfred E. Smith
Assistant Examiner—J. Berman
Attorney, Agent, or Firm—Stanley Z. Cole

[57] ABSTRACT

A method for pretreatment of a photoresist layer adhered to a semiconductor wafer prior to charged particle beam processing. The method includes bombarding the photoresist layer with ions which are electrically inactive with respect to the wafer. Suitable ions include ions of the noble gases. The pretreatment method causes rapid photoresist outgassing and carbonization without altering the electrical properties of the wafer. Outgassing during subsequent processing is thereby reduced. The pretreatment method is particularly applicable to ion implantation wherein dose measurement errors resulting from photoresist outgassing are reduced. The pretreatment method is performed at high current to minimize the effect on system throughput.

15 Claims, 3 Drawing Sheets

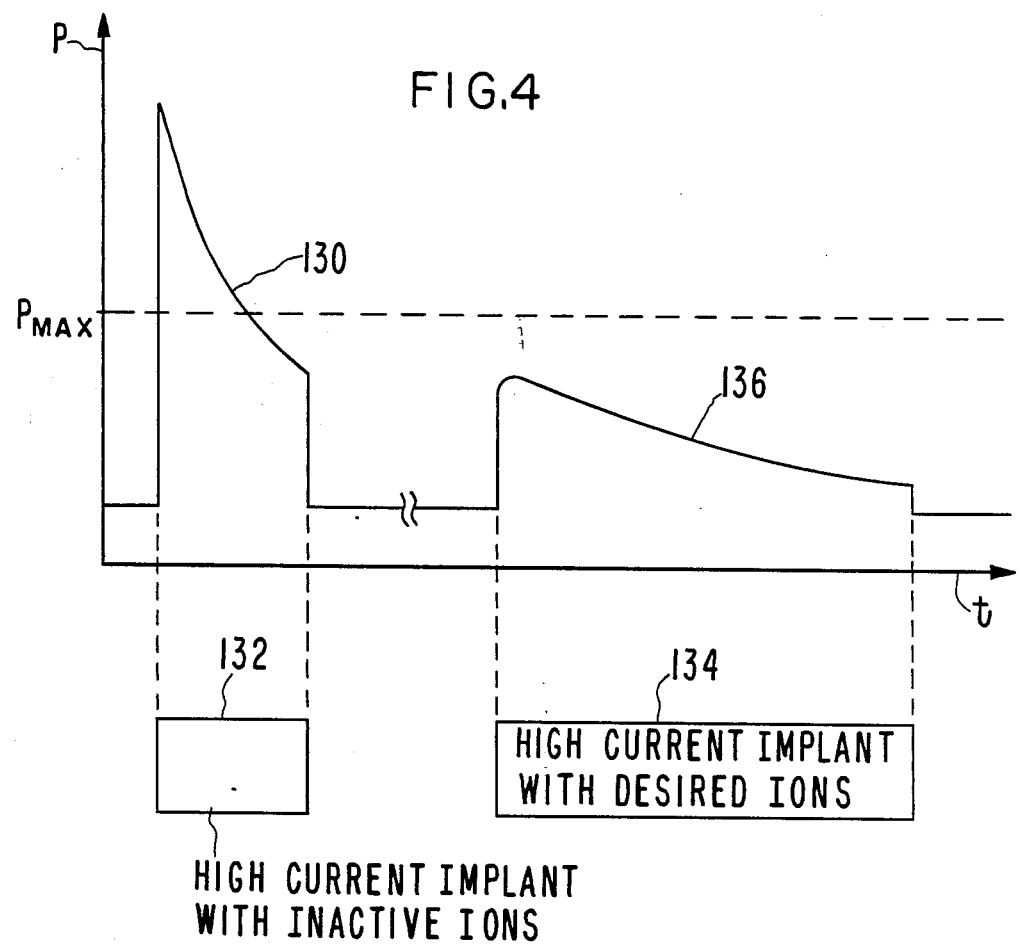

METHOD FOR PHOTORESIST PRETREATMENT PRIOR TO CHARGED PARTICLE BEAM PROCESSING

BACKGROUND OF THE INVENTION

This invention relates to charged particle beam processing of semiconductor wafers in vacuum and, more particularly, to a method for pretreatment of a masking layer adhered to the surface of the semiconductor wafer prior to implantation of dopant ions.

Ion implantation has become a standard technique for introducing impurities into semiconductor wafers in a controlled and rapid manner. A beam of ions is generated in a source and directed with varying degrees of acceleration toward the semiconductor wafer. The impurities are introduced into the bulk of semiconductor wafers by using the momentum of the ions as a means of embedding them in the crystalline lattice of the semiconductor material. Maintaining uniformity of impurity concentration over the surface of the semiconductor wafer and controlling total impurity dosage are of utmost importance in semiconductor processing. In addition, one of the major objectives in commercial semiconductor processing is to achieve a high throughput in terms of wafers processed per unit time.

Prior to the ion implantation process, each semiconductor wafer is typically coated with a masking layer such as a photoresist layer. A desired pattern to be ion implanted is produced in the photoresist layer by conventional photolithographic techniques. The photoresist layer is removed in areas where ion implantation is to take place and remains as a mask over the remainder of the wafer surface.

During ion implantation, the ion beam is scanned over the surface of the wafer by electrostatic, magnetic or mechanical means, or by a combination thereof. In the regions where the photoresist layer has been removed, the ions penetrate into the bulk of the semiconductor material and produce desired doping characteristics. In the regions where the photoresist layer remains on the surface of the wafer, the ions penetrate the photoresist and undergo collisions with electrons and nuclei of the photoresist material and eventually come to rest. Since the photoresist material is usually an organic polymer, the energetic ions cause scission of hydrocarbon chains as they travel through the resist material. As a result, outgassing of hydrogen, water vapor and other materials from the surface of the photoresist layer occurs, and at least the outer portion of the photoresist layer is carbonized.

As is well known, ion implantation is performed in a vacuum, wherein the pressure is preferably maintained at or below $1 \times 10^{-5}$ Torr. When the above-described outgassing of materials from the photoresist occurs, the pressure level in the processing chamber increases. The increase in pressure in the processing chamber produces errors in the measured dose due to collisions between the ion beam and the gas molecules outside the Faraday measuring system. When these collisions occur, some of the ions in the ion beam are neutralized. Since the Faraday system registers dopant atoms only if they carry an electrical charge, the Faraday system is not able to measure the neutralized portion of the ion beam, and a dose error is introduced. As noted above, such dose errors are unacceptable, particularly in the fabrication of LSI or VLSI integrated circuits, where device characteristics can be substantially altered by dose errors.

It has been observed that the peak value of the pressure increase, or pressure burst, caused by photoresist outgassing increases as the ion beam current is increased. As the peak value of the pressure burst increases, the potential dose error is similarly increased. Thus, attempts to improve the throughput of ion implantation systems by increasing beam current have been frustrated by photoresist outgassing. For lower ion beam currents, the pressure burst caused by photoresist outgassing has a lower peak value but is longer in duration. Ion implantation has, therefore, often been performed in a two-step process to keep the above-described dose errors within acceptable limits. First, a relatively low current implant of the dopant ions is performed until photoresist outgassing is substantially completed. Then a high current implant of the same dopant ions is used to achieve the desired dose. While such an approach keeps dose errors within acceptable limits, throughput is reduced significantly by the first low current step of the process.

It is therefore an object of the present invention to provide a novel method for increasing the throughput of ion implantation systems.

It is another object of the present invention to provide a method for ion implantation wherein the dose errors caused by photoresist outgassing are substantially reduced without significantly reducing system throughput.

It is still another object of the present invention to provide a method for pretreatment of a masking layer prior to charged particle beam processing in vacuum.

SUMMARY OF THE INVENTION

According to the present invention, these and other objects and advantages are achieved in a method for pretreatment of a masking layer covering at least a portion of the surface of a substrate prior to charged particle beam processing in vacuum. The method comprises the step of bombarding the masking layer with ions of an element which is substantially electrically inactive when implanted in the substrate. Subsequently, the charged particle beam process is performed. Typically, the substrate and the masking layer are implanted with ions of a desired dopant species. The step of bombarding causes outgassing of the masking layer without substantially altering the electrical properties of the substrate and thereby reduces outgassing of the masking layer during the subsequent charged particle beam process.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 4 illustrates photoresist outgassing and the method for ion implantation in accordance with the present invention.

DETAILED DESCRIPTION OF THE INVENTION

Figure 1:
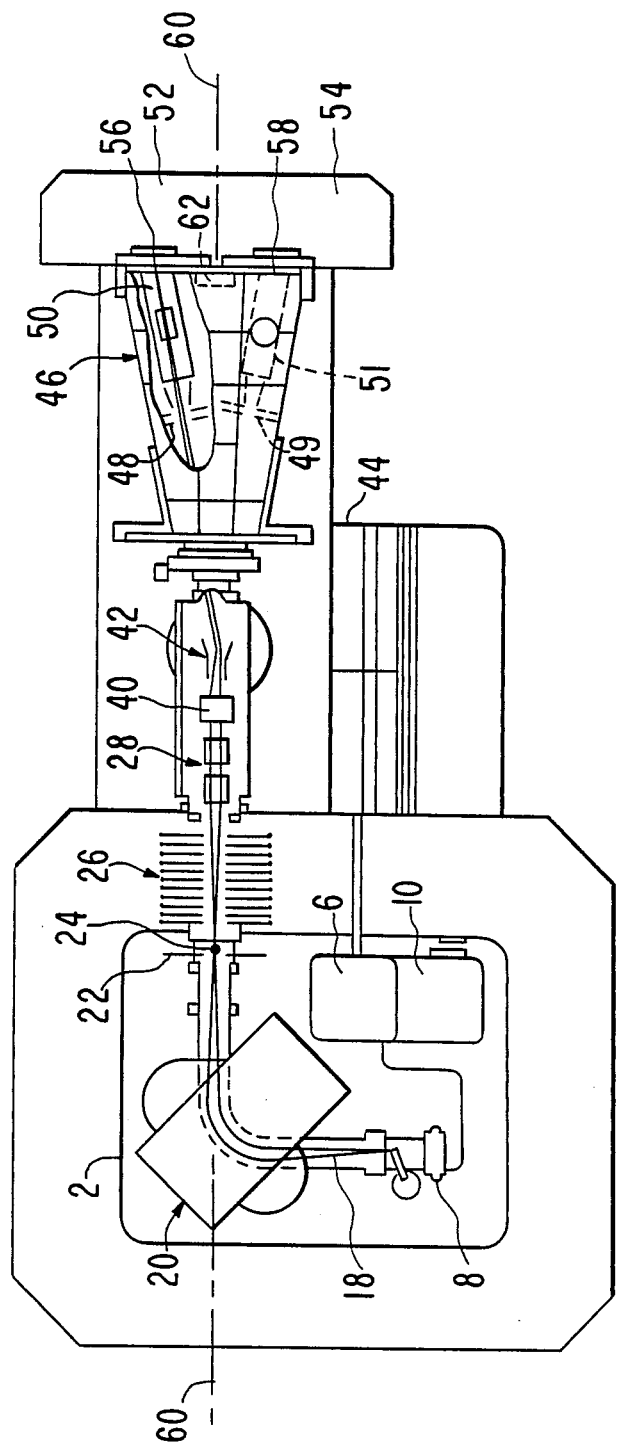
FIG. 1 is a schematic diagram, viewed from above, of an implantation system which can be used to practice the method of the present invention.

An example of an ion implantation system suitable for the practice of the method of the present invention is illustrated in FIG. 1. A high voltage terminal 2 is held at high potential relative to ground by a high voltage power supply (not shown). The terminal 2 houses the apparatus required to form a beam of ions of desired species. In common practice, a gaseous feedstock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as a quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates to form the desired scanning pattern are provided by a scanning system 44.

A dual target chamber 46 includes a housing, beam defining masks 48, 49 and Faraday cages 50, 51 for beam monitoring. Automatic wafer transfer systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. Target positions 56, 58 are typically located within airlocks and are displaced horizontally on opposite sides of the longitudinal axis 60 of the undeflected beam 18, such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
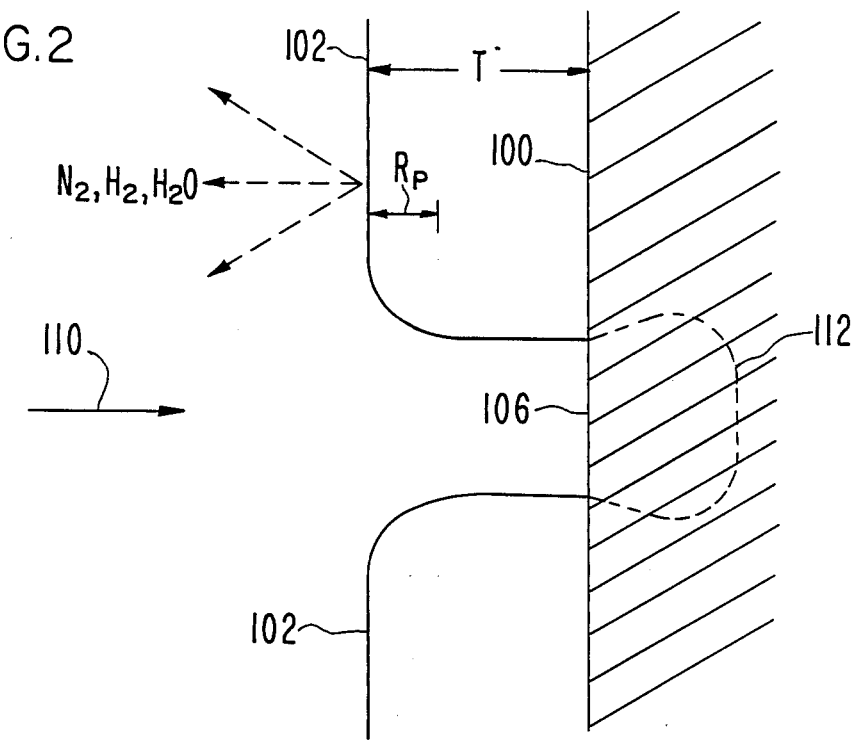
FIG. 2 is a partial cross-sectional view of a semiconductor wafer and a patterned photoresist layer.

In FIG. 2, there is shown a partial cross-sectional view of a semiconductor wafer 100 having a patterned masking layer, which in the present example is photoresist layer 102, adhered to its surface. After patterning by conventional photolighographic techniques, the photoresist layer 102 has openings which expose portions of the surface of the underlying wafer 100. In FIG. 2, the area 106 of the wafer 100 is exposed. The wafer 100 is typically silicon, while the photoresist layer 102 is typically an organic polymer. One frequently used positive photoresist is AZ137OJ produced by Shipley.

The wafer 100 is positioned in one of the target positions 56, 58 of the system shown in FIG. 1, and an ion beam 110 indicated schematically by the arrow in FIG. 2 is scanned over the surface of the wafer 100. The scanning pattern is carefully controlled to ensure uniformity over the surface of the wafer 100. A suitable scanning pattern is disclosed in U.S. Pat. No. 4,283,631, issued Aug. 11, 1981 to Turner. The total impurity dosage applied to the wafer 100 per unit area is also carefully controlled. The dosage is monitored by the Faraday cages 50, 51 and associated measuring circuitry. Ion implantation is stopped when a prescribed dosage level is reached. The ions in the ion beam 110, which can have energies of up to 200 keV, penetrate into the wafer 100 in the area 106 and form an impurity doped region 112. The distribution of ions in a direction normal to the surface of the wafer 100 is Gaussian. Such distribution results from random collisions between the energetic ions and the nuclei and electons of the wafer material. Similarly, the ions in the ion beam 110 penetrate into the photoresist layer 102 and are eventually stopped by collisions with the nuclei and electrons of the resist material. The distribution of ions in the photoresist layer 102 is also Gaussian in a direction normal to the surface of the layer 102. The peak of the Gaussian distribution, that is, the location in the layer 102 with the maximum ion concentration, is at a distance known as the projected range $R_p$ below the surface of the layer 102. The projected range $R_p$ depends on the energy of the ion beam 110, the type of ions in the ion beam 110 and the composition of the photoresist layer 102. The thickness T of the photoresist layer 102 is usually chosen to be:

$$T > R_p + 5\Delta R_p$$

where $\Delta R_p$ is proportional to the standard deviation of the ion concentration in the layer 102. When this condition is met, less than one in $10^6$ of the incident ions penetrate through the photoresist layer 102 into the wafer 100 (T. C. Smith, "Wafer Cooling and Photoresist Masking Problems in Ion Implantation," Fourth International Conference, Ion Implantation: Equipment and Techniques, Berchtesgaden, West Germany, Sept. 13–17, 1982).

Figure 3:
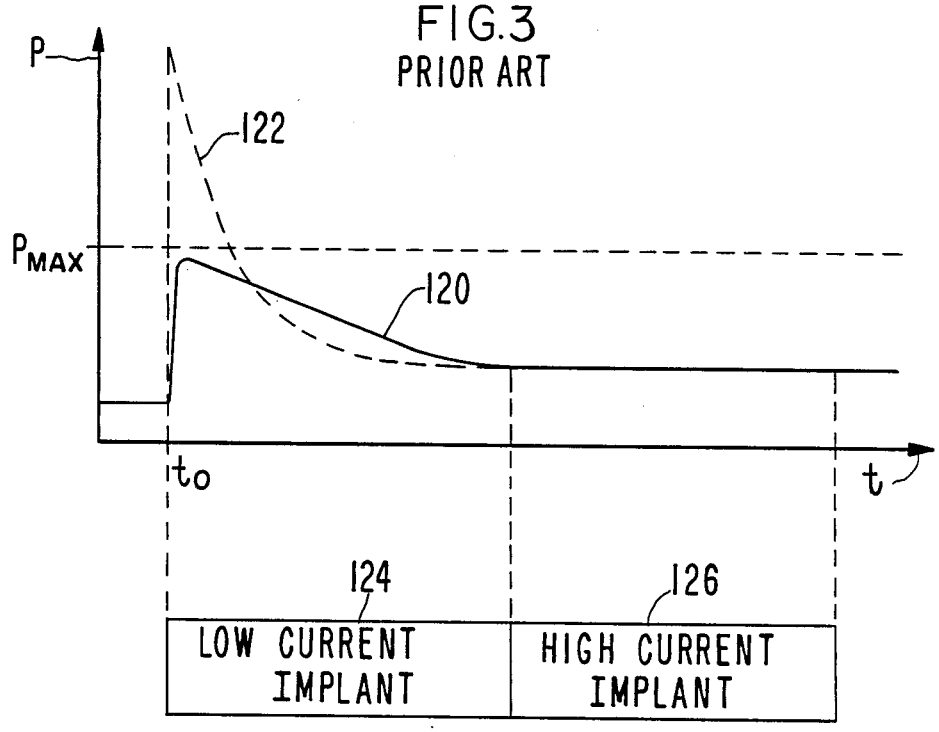
FIG. 3 illustrates photoresist outgassing and a method for ion implantation in accordance with the prior art.

Various chemical bonds are broken by the energetic incident ions as they penetrate the bulk of the resist material which is usually a hydrocarbon. As a result, outgassing of hydrogen, nitrogen, water vapor and other residual gases from the surface of the photoresist layer 102 occurs, and a portion of the photoresist layer 102 is carbonized. The width of the carbonized region corresponds to the projected range $R_p$ of the incident ions. The gases liberated from the surface of the photoresist layer 102 cause a pressure increase, or pressure burst, in the evacuated target chamber 46. The peak value of the pressure burst depends on the ion beam current, or number of ions in the ion beam 110. When the ion beam current is relatively high, scission of hydrocarbon chains, and therefore outgassing, proceeds at a faster rate. Referring now to FIG. 3, there is shown a graphic representation of the pressure burst caused by outgassing of the photoresist layer 102. The pressure P in the target chamber 46 is plotted as a function of time. At time $t_o$, the ion beam 110 is applied to the photoresist layer 102. For a moderate ion beam current, for example 0.2 milliamp, the pressure burst is indicated by the curve 120 in FIG. 3. When the ion beam current is increased to a relatively high level, for example 1 milliamp, the pressure burst is described by the curve 122 in FIG. 3. It can be seen that the curve 122 has a higher peak value and a shorter time duration than the curve 120 in FIG. 3. In each case, however, the pressure burst has a limited time duration.

When the pressure in the target chamber 46 increases, the number of neutralizing collisions between dopant ions in the beam 110 and residual gas molecules increases. Since the Faraday system registers dopant ions only if they carry an electrical charge, it is not able to measure the portion of the ion beam neutralized outside the Faraday cage, and dose measurement errors are introduced. Therefore, in order to maintain dose accuracy within acceptable limits, the pressure P in the target chamber 46 must be maintained below some maximum value $P_{max}$, such as $2 \times 10^{-5}$ Torr. Since, as noted above, the pressure burst caused by photoresist outgassing increases with beam current, efforts to improve system throughput by increasing beam current have encountered the problem of dose inaccuracies.

In the past, one approach to improving system throughput while avoiding the problem of photoresist outgassing has been to utilize a two-step ion implantation, as illustrated in FIG. 3. A low beam current of the dopant ions is utilized during photoresist outgassing. Then the implant is completed at the highest practical beam current. When, for example, the desired implant is $5 \times 10^{15}$ phosphorous ions/cm$^2$ at an ion current of 1 milliamp, a current of 0.2 milliamp is used during a first implant 124 to implant a dose of $1 \times 10^{15}$ ions/cm$^2$, and the pressure burst caused by photoresist outgassing follows the curve 120. After photoresist outgassing is substantially complete, the ion beam current is increased to 1.0 milliamp during a second implant 126, and $4 \times 10^{15}$ ions/cm$^2$ are implanted. The total implant time has been improved over the case in which low beam current is used throughout, but not as much as desired.

A method of ion implantation in accordance with the present invention is illustrated in FIG. 4. A two-step process is employed. Both steps can be performed by the ion implantation system illustrated in FIG. 1 and described hereinabove. In a first implant step 132, the photoresist layer 102 is pretreated by bombardment thereof, at the highest practical current, with ions which are electrically inactive with respect to the layer 102 and the wafer 100. Rapid outgassing of hydrogen, nitrogen and water vapor from the photoresist layer 102 takes place during the first step 132, as indicated by the curve 130 in FIG. 4. Pressure P in the chamber 46 is plotted as a function of time t in FIG. 4. The ions used in the first step 132 do not alter the electronic properties of the wafer 100 or compromise the masking properties of the photoresist layer 102. Therefore, the dose measurement errors during the first step 132 which result from the pressure burst caused by photoresist outgassing are of no consequence.

When outgassing is substantially completed, a second implant step 134 with ions of a desired dopant species can proceed. In the second step 134, the desired species is implanted at the highest current consistent with the capabilities of the ion source 8 and the wafer cooling provided in the wafer transfer systems 52, 54. As indicated by the curve 136 in FIG. 4, significant outgassing of the layer 102 does not take place during the second step 134, since the layer 102 was carbonized during the first step 132. Therefore, dose measurement errors are kept within acceptable limits. Furthermore, since the implant steps 132, 134 are both performed at a high current level, the total implant time is much less than the implant time according to the above-described prior art method. For example, the first implant step 132 can utilize a current of 1 milliamp whereas the first implant 124 according to the prior art requires a current reduction to 0.2 milliamp.

The steps 132 and 134 are illustrated in FIG. 4 as separated in time to allow sufficient time to change ion types in the implantation system. However, the changeover time does not substantially reduce overall system throughput. In a practical example of the present method, a batch of wafers is implanted with electrically inactive ions to cause photoresist outgassing, as described hereinabove. The batch of wafers can be implanted either one at a time in the system of FIG. 1 or many at a time in an appropriate batch processing system. After completion of the batch, the source gas is changed to the desired dopant species, and the implantation system is appropriately readjusted. Alternatively, the implant can proceed on another implanter which is already operating with the desired dopant species. Then the batch of wafers is again processed through the system and the desired dopant ions are implanted as described hereinabove. The total processing time for the batch is substantially reduced in comparison with prior art methods while dose accuracy is maintained.

Suitable electrically inactive ions for the first implant step 132 include ions of the noble gases, such as 40Ar+, 20Ne+ and 4He+. When the wafer 100 is silicon, silicon ions can be used during the first step 132 to produce rapid photoresist outgassing. Similarly, when the wafer 100 is gallium arsenide, gallium or arsenic ions can be utilized in the first step 132.

The mass and energy of the electrically inactive ions should be chosen to provide a projected range in the photoresist layer 102 equal to or greater than the projected range in the layer 102 of the dopant ions. This insures that the width of the carbonized region is equal to or greater than the width of the region traversed by the dopant ions during the second implant step 134. The dose of electrically inactive ions utilized in the first implant step 132 should be sufficient to cause substantially complete carbonization in the desired region of the layer 102. A critical dose, $D_c$, required to completely carbonize a given region of a photoresist layer, has been defined by T. C. Smith, supra, as:

$$D_c \simeq \frac{C_{max}(R_p)}{M_g}$$

where
$C_{max}(R_p)$ = concentration of atoms in carbonized photoresist region of width $R_p$.
$M_g$ = gas multiplier equal to number of gas molecules released per incident ion of energy $E_i$.

Under typical ion implantation conditions, the critical dose is on the order of $1 \times 10^{15}$ ion/cm$^2$. When the above conditions are met, very little outgassing of the photoresist layer 102 occurs during the second implant step 134.

The current utilized during bombardment of the layer 102 by the electrically inactive ions is the highest level consistent with the capabilities of the ion source 8 and the wafer cooling provided by the wafer transfer systems 52, 54. The photoresist layer 102 typically must be maintained below a temperature of about 110° C. to avoid melting, plastic flow or other deterioration. Since the first step 132 is performed at relatively high current, photoresist outgassing is substantially completed in a very short time. Thus, the first step 132 makes a small contribution to the overall processing time.

Table 1 lists examples of electrically inactive ions suitable for use with various commonly used impurity dopants.

TABLE 1

| Impurity Dopant | Electrically Inactive Ion |
|---|---|
| $31P^+$ | $20Ne^+$, $40Ar^+$ |
| $75As^+$ | $40Ar^+$ |
| $11B^+$ | $4He^+$ |

While the first implant step 132 does not substantially affect the electrical properties of the wafer 100, it does produce some effects. One such effect is amorphitization of the single crystal silicon lattice, as well known in the art. When the dose is adequate, amorphitization can also result from the second implant step 134. Amorphitization is often beneficial to reduce channeling. See, for example, Witson and Brewer, *Ion Beams With Application to Ion Implantation*, R. Kreiser Publishing Co., Huntington, N.Y., 1979, Reprint of J. Wiley, New York, 1973, pp. 277-278. In any case, amorphitization is of no consequence, as the subsequent high temperature anneal process utilized to electrically activate the dopant also regrows the crystalline structure and thereby eliminates amorphitization effects.

To demonstrate the effect of photoresist pretreatment in accordance with the present invention, photoresist coated wafers with and without pretreatment were implanted as shown in Table 2.

TABLE 2

| Wafer No. 1: | Pretreatment - None<br>Implant Parameters - $31P^+$, 0.1 milliamp, 80 keV<br>Baseline Pressure - $0.9 \times 10^{-6}$ Torr<br>Peak Pressure Burst - $4 \times 10^{-6}$ Torr |
|---|---|
| Wafer No. 2: | Pretreatment - None<br>Implant Parameters - $31P^+$, 1.0 milliamp, 80 keV<br>Baseline Pressure - $1.23 \times 10^{-6}$ Torr<br>Peak Pressure Burst - $1.9 \times 10^{-5}$ Torr |
| Wafer No. 3: | Pretreatment - $40Ar^+$, 1.0 milliamp, 120 keV, $1 \times 10^{15}$ ions/cm$^2$<br>Implant Parameters - $31P^+$, 1.0 milliamp, 80 keV<br>Baseline Pressure - $1.26 \times 10^{-6}$ Torr<br>Peak Pressure Burst - $3.6 \times 10^{-6}$ Torr |

The energy of the $40Ar^+$ pretreatment was chosen so that the projected ranges of the $31P^+$ and the $40Ar^+$ were about the same. For equal implant currents, the pressure burst due to photoresist outgassing is significantly lower for the pretreated wafer. In fact, the pressure burst for the pretreated wafer implanted with $31P^+$ at 1.0 milliamp is lower than that produced by an untreated wafer implanted with $31P^+$ at 0.1 milliamp. It is noted that the baseline pressures in the above test were considerably lower than the baseline pressures experienced during high throughput ion implantation. In the case of normal ion implantation, other gas sources, such as introduction of wafers through air locks, increase the operating pressure at a given instant of time. The pressure burst due to photoresist outgassing appears as an increase above that operating pressure.

The method for pretreatment of photoresist in accordance with the present invention has been described in connection with ion implantation. However, it will be realized by those skilled in the art that the pretreatment method described hereinabove is applicable in connection with any charged particle beam treatment which causes unwanted outgassing from a photoresist layer. For example, the pretreatment method can be utilized in ion etching.

While there has been shown and described what is at present considered the preferred embodiments of the invention, it will be obvious to those skilled in the art that various changes and modifications may be made therein without departing from the scope of the invention as defined by the appended claims.

What is claimed is:

1. A method for ion implantation of a substrate having an organic polymer masking layer covering at least a portion of its surface comprising the steps of:
    bombarding said masking layer with ions of an element which is substantially electrically inactive when implanted in said substrate; and, subsequently,
    implanting said substrate and said masking layer with ions of a desired dopant species,
    whereby said step of bombarding causes outgassing of said masking layer without substantially altering the electrical properties of said substrate and thereby reduces outgassing of said masking layer during said step of implanting ions of the desired dopant species.

2. The method for ion implantation as defined in claim 1 further including the step of providing the ions used in said step of bombarding said masking layer with energy selected so that the ions have a projected range in said masking layer at least as great as the projected range of the ions of said desired dopant species to be implanted in said step of implanting.

3. The method for ion implantation as defined in claim 2 further including the step of providing a dosage of the ions used in said step of bombarding said masking layer sufficient to carbonize said masking layer to a depth at least as great as the projected range of the ions of said desired dopant species.

4. The method for ion implantation as defined in claim 2 wherein said substrate is a silicon semiconductor wafer.

5. The method for ion implantation as defined in claim 4 wherein the ions used in said step of bombarding said masking layer include ions of a noble gas.

6. The method for ion implantation as defined in claim 5 wherein the ions used in said step of bombarding said masking layer include $40Ar^+$.

7. The method for ion implantation as defined in claim 4 wherein the ions used in said step of bombarding said masking layer include silicon ions.

8. The method for ion implantation as defined in claim 2 wherein said substrate is a gallium arsenide wafer.

9. The method for ion implantation as defined in claim 8 wherein the ions used in said step of bombarding said masking layer include ions of a noble gas.

10. The method for ion implantation as defined in claim 9 wherein the ions used in said step of bombarding said masking layer include $40Ar^+$.

11. The method for ion implantation as defined in claim 8 wherein the ions used in said step of bombarding said masking layer are selected from the group consisting of gallium ions, arsenic ions and mixtures thereof.

12. A process for ion implantation of a substrate having an organic polymer masking layer covering at least a portion of its surface comprising the steps of:
    bombarding said masking layer with ions of an element which is substantially electrically inactive when implanted in said substrate;
    subsequently implanting said substrate and said masking layer with ions of a desired dopant species; and measuring the ion dosage of said dopant species implanted in said substrate and said masking layer with a charge collection device, whereby outgassing of said masking layer during said step of implanting ions of the desired dopant species is reduced and an accurate measurement of ion dosage is obtained.

13. The process for ion implantation as defined in claim 12 further including the step of providing the ions used in said step of bombarding said masking layer with energy selected so that the ions have a projected range in said masking layer at least as great as the projected range of the ions of said desired dopant species.

14. The process for ion implantation as defined in claim 13 further including the step of providing a dosage of the ions used in said step of bombarding said masking layer sufficient to carbonize said masking layer to a depth at leat as great as the projected range of the ions of said desired dopant species.

15. A process for ion beam treatment of a substrate having an organic polymer masking layer covering at least a portion of its surface comprising the steps of:

bombarding said masking layer with ions of an element which is substantially electrically inactive when implanted in said substrate;

subsequently treating said substrate and said masking layer with an ion beam of a desired species; and measured with a charge collection device the ion dosage of said desired species with which said substrate and said masking layer are treated, whereby an accurate measurement of ion dosage is obtained.

* * * * *